United States Patent
Saito et al.

(10) Patent No.: US 9,755,042 B2
(45) Date of Patent: Sep. 5, 2017

(54) INSULATED GATE SEMICONDUCTOR DEVICE AND METHOD FOR MANUFACTURING THE INSULATED GATE SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Jun Saito, Nagoya (JP); Tomoharu Ikeda, Nisshin (JP); Tomoyuki Shoji, Nagakute (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/124,920

(22) PCT Filed: Feb. 10, 2015

(86) PCT No.: PCT/JP2015/053692
§ 371 (c)(1),
(2) Date: Sep. 9, 2016

(87) PCT Pub. No.: WO2015/156023
PCT Pub. Date: Oct. 15, 2015

(65) Prior Publication Data
US 2017/0025516 A1    Jan. 26, 2017

(30) Foreign Application Priority Data
Apr. 9, 2014    (JP) .................................. 2014-080040

(51) Int. Cl.
*H01L 29/06*    (2006.01)
*H01L 29/66*    (2006.01)
(Continued)

(52) U.S. Cl.
CPC ...... *H01L 29/66068* (2013.01); *H01L 21/046* (2013.01); *H01L 21/76237* (2013.01);
(Continued)

(58) Field of Classification Search
CPC ........... H01L 29/66068; H01L 29/0615; H01L 29/0619; H01L 29/623; H01L 29/0649;
(Continued)

(56) References Cited

U.S. PATENT DOCUMENTS 5,572,057 A * 11/1996 Yamamoto .......... G01P 15/0802
257/417
6,380,569 B1    4/2002 Chang et al.
(Continued)

FOREIGN PATENT DOCUMENTS

CN    101048874 A    10/2007
JP    H11-87698 A    3/1999
(Continued)

OTHER PUBLICATIONS

Feb. 23, 2017 Office Action issued in U.S. Appl. No. 15/104,332.
(Continued)

*Primary Examiner* — John C Ingham
*Assistant Examiner* — Gustavo Ramallo
(74) *Attorney, Agent, or Firm* — Oliff PLC

(57) ABSTRACT

An insulated gate semiconductor device provided herein includes a front electrode and a rear electrode and is configured to switch a conducting path between the front electrode and the rear electrode. The insulated gate semiconductor device includes a first circumferential trench provided in the front surface; a second circumferential trend provided in the front surface and deeper than the first circumferential trench; a fifth region of a second conductivity type exposed on a bottom surface of the first circumferential trench; a sixth region of the second conductivity
(Continued)

type exposed on a bottom surface of the second circumferential trench; and a seventh region of a first conductivity type connected to the third region and separating the fifth region from the sixth region. A front side end portion of the sixth region being located on a rear side with respect to a rear side end portion of the fifth region.

13 Claims, 10 Drawing Sheets

(51) Int. Cl.
| | |
|---|---|
| H01L 21/04 | (2006.01) |
| H01L 21/762 | (2006.01) |
| H01L 29/10 | (2006.01) |
| H01L 29/78 | (2006.01) |
| H01L 29/16 | (2006.01) |
| H01L 29/739 | (2006.01) |
| H01L 29/423 | (2006.01) |

(52) U.S. Cl.
CPC ...... *H01L 29/0615* (2013.01); *H01L 29/0619* (2013.01); *H01L 29/0623* (2013.01); *H01L 29/0649* (2013.01); *H01L 29/0696* (2013.01); *H01L 29/105* (2013.01); *H01L 29/66734* (2013.01); *H01L 29/7811* (2013.01); *H01L 29/7813* (2013.01); *H01L 29/1608* (2013.01); *H01L 29/4238* (2013.01); *H01L 29/42368* (2013.01); *H01L 29/7397* (2013.01)

(58) Field of Classification Search
CPC ............... H01L 29/0696; H01L 29/105; H01L 29/66734; H01L 29/7811; H01L 29/7813; H01L 21/046; H01L 21/76237
See application file for complete search history.

(56) References Cited

U.S. PATENT DOCUMENTS

| 7,999,312 | B2* | 8/2011 | Takaya ................ H01L 29/0623 257/330 |
|---|---|---|---|
| 2004/0248389 | A1 | 12/2004 | Iwabuchi |
| 2008/0087951 | A1* | 4/2008 | Takaya ................ H01L 29/0623 257/334 |
| 2010/0224932 | A1 | 9/2010 | Takaya et al. |
| 2012/0326207 | A1 | 12/2012 | Yoshimochi |
| 2013/0087852 | A1 | 4/2013 | Kim et al. |
| 2013/0207172 | A1 | 8/2013 | Hsieh |
| 2014/0221427 | A1 | 8/2014 | Muller et al. |
| 2016/0211319 | A1 | 7/2016 | Saito et al. |
| 2016/0329422 | A1 | 11/2016 | Saito et al. |

FOREIGN PATENT DOCUMENTS

| JP | 2003-517725 A | 5/2003 |
|---|---|---|
| JP | 2005-223349 A | 8/2005 |
| JP | 2006-128507 A | 5/2006 |
| JP | 2007-173319 A | 7/2007 |
| JP | 2008-135522 A | 6/2008 |
| JP | 2010-062361 A | 3/2010 |
| JP | 2012-238741 A | 12/2012 |
| JP | 2015-065237 A | 4/2015 |
| JP | 2015-126085 A | 7/2015 |
| TW | 200302556 A | 8/2003 |
| TW | 201322451 A | 6/2013 |

OTHER PUBLICATIONS

U.S. Appl. No. 15/104,332, filed Jun. 14, 2016 in the name of Jun Saito et al.

Jun. 6, 2017 Notice of Allowance issued in U.S. Appl. No. 15/104,332.

\* cited by examiner

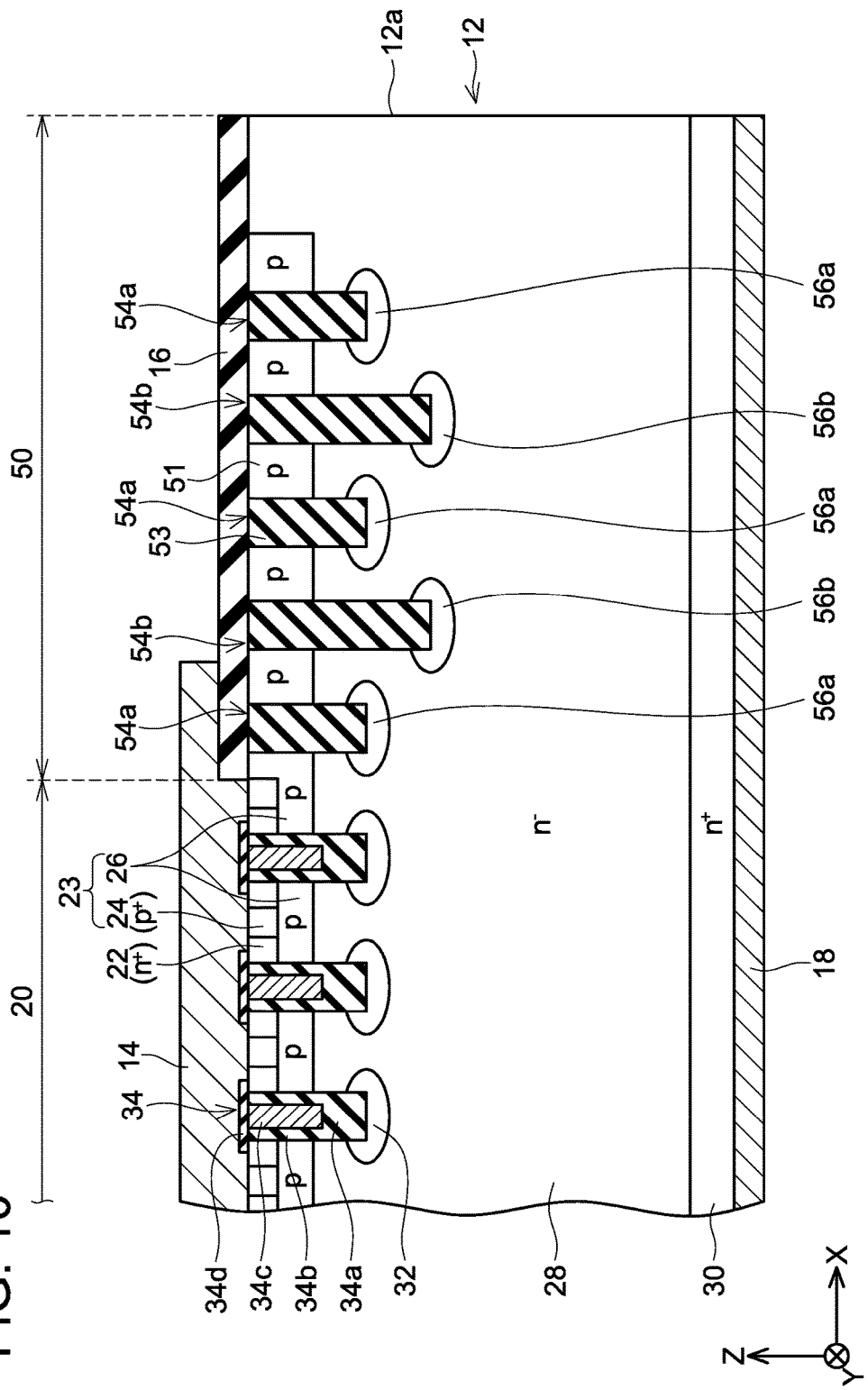

INSULATED GATE SEMICONDUCTOR DEVICE AND METHOD FOR MANUFACTURING THE INSULATED GATE SEMICONDUCTOR DEVICE

CROSS-REFERENCE TO RELATED APPLICATIONS

This application is a related application of Japanese Patent Application No. 2014-080040 filed on Apr. 9, 2014 and claims priority to this Japanese Patent Application, the entire contents of which are hereby incorporated by reference into the present application.

TECHNICAL FIELD

The art disclosed in the present teachings relates to an insulated gate semiconductor device and a method for manufacturing the insulated gate semiconductor device.

BACKGROUND ART

Japanese Patent Application Publication No. 2008-135522 (hereinafter referred to as Patent Literature 1) discloses an insulated gate semiconductor device that has an element region having a MOS structure provided therein, and an outer circumferential region around the element region. The element region has a plurality of gate trenches provided therein, and a gate insulating film and a gate electrode are provided in each of the gate trenches. In a range exposed on a bottom surface of the gate trench, a p-type bottom surface surrounding region (hereinafter referred to as an element portion bottom surface surrounding region) is provided. In the outer circumferential region, a plurality of trenches are provided to surround the element region, and each of the trenches is filled with an insulating layer. In a range exposed on a bottom surface of each of the trenches in the outer circumferential region, a p-type bottom surface surrounding region (hereinafter referred to as an outer circumferential portion bottom surface surrounding region) is provided. When a MOSFET is turned off, a depletion layer spreads in the element region, from the element portion bottom surface surrounding region into a drift region. This promotes depletion of the drift region in the element region. Moreover, a depletion layer spreads in the outer circumferential region, from the outer circumferential portion bottom surface surrounding region into the drift region. This promotes depletion of the drift region in the outer circumferential region. Accordingly, the withstand voltage of the insulated gate semiconductor device is improved.

SUMMARY OF INVENTION

Technical Problem

In the insulated gate semiconductor device in Patent Literature 1, in the element region, depletion layers spread approximately at the same time from the element portion bottom surface surrounding regions, respectively. In a portion of the drift region interposed between the two element portion bottom surface surrounding regions, depletion proceeds from both sides, and hence that portion of the drill region is easily depleted. In contrast to this, in the outer circumferential region, when a depletion layer that spreads from the element region reaches the first outer circumferential portion bottom surface surrounding region in the outer circumferential region (the outer circumferential portion bottom surface surrounding region closest to the element region), the depletion layer extends toward the second outer circumferential portion bottom surface surrounding region from the first outer circumferential portion bottom surface surrounding region (the second outer circumferential portion bottom surface surrounding region from the element region). When the depletion layer reaches the second outer circumferential portion bottom surface surrounding region, the depletion layer extends from the second outer circumferential portion bottom surface surrounding region toward the third outer circumferential portion bottom surface surrounding region. As such, the depletion layer successively spreads through each of the outer circumferential portion bottom surface surrounding regions. Therefore, in a portion of the drift region interposed between the two outer circumferential portion bottom surface surrounding regions, depletion proceeds from one side only. Therefore, to sufficiently deplete the outer circumferential region, it is desirable to make a spacing between the outer circumferential portion bottom surface surrounding regions much narrower. However, if the spacing between the outer circumferential portion bottom surface surrounding regions is made narrower, there may be a case where the outer circumferential portion bottom surface surrounding regions are mutually connected owing to errors in manufacturing steps, and hence there occurs a problem of failing to obtain a necessary withstand voltage.

Solution to Technical Problem

An insulated gate semiconductor device disclosed herein, comprises: a semiconductor substrate; a front electrode provided on a front surface of the semiconductor substrate; and a rear electrode provided on a rear surface of the semiconductor substrate. The insulated gate semiconductor device is configured to switch a conducting path between the front electrode and the rear electrode. The semiconductor substrate comprises; a first region of a first conductivity type being in contact with the front electrode; a second region of a second conductivity type being in contact with the front electrode and the first region; a third region of the first conductivity type separated from the first region by the second region; a plurality of gate trenches provided in the front surface and penetrating the second region so as to reach the third region; a plurality of fourth regions of the second conductivity type each of which is exposed on a bottom surface of the corresponding gate trench; a first circumferential trench provided in the front surface in a range outside the second region; a second circumferential trench provided in the front surface in a range outside the second region and having a depth deeper than a depth of the first circumferential trench; a fifth region of the second conductivity type exposed on a bottom surface of the first circumferential trench; a sixth region of the second conductivity type exposed on a bottom surface of the second circumferential trench, a front side end portion of the sixth region being located on a rear side with respect to a rear side end portion of the fifth region; and a seventh region of the first conductivity type connected to the third region and separating the fifth region from the sixth region.

Notably, the second circumferential trench may be provided on an outer circumferential side of the first circumferential trench (a side farther from the second region), or may be provided on an inner circumferential side of the first circumferential trench (a side closer to the second region).

Moreover, the first conductivity type is any one of an n-type and p-type, and the second conductivity type is the other of the n-type and the p-type.

In this insulated gate semiconductor device, extension of the depletion layer in the range outside the second region is promoted by the fifth region exposed on the bottom surface of the first circumferential trench, and the sixth region exposed on the bottom surface of the second circumferential trench. In this insulated gate semiconductor device, the front side end portion of the sixth region is located on the rear side with respect to the rear side end portion of the fifth region. In other words, the fifth and sixth regions differ in positions in a depth direction (i.e., a thickness direction of the semiconductor substrate). Therefore, even if manufacturing errors cause a displacement in relative positions of the fifth and sixth regions in a plane direction of the semiconductor substrate (i.e., a direction along the front surface of the semiconductor substrate), the fifth and sixth regions can be prevented from being connected.

BRIEF DESCRIPTION OF DRAWINGS

FIG. 8 is a vertical cross-sectional view, corresponding to FIG. 2, in the case where a second outer circumferential trench 54b is displaced positionally relative to a first outer circumferential trench 54a;

FIG. 10 is a vertical cross-sectional view, corresponding to FIG. 2, of a semiconductor device in a second variation.

DESCRIPTION OF EMBODIMENTS

Figure 1:
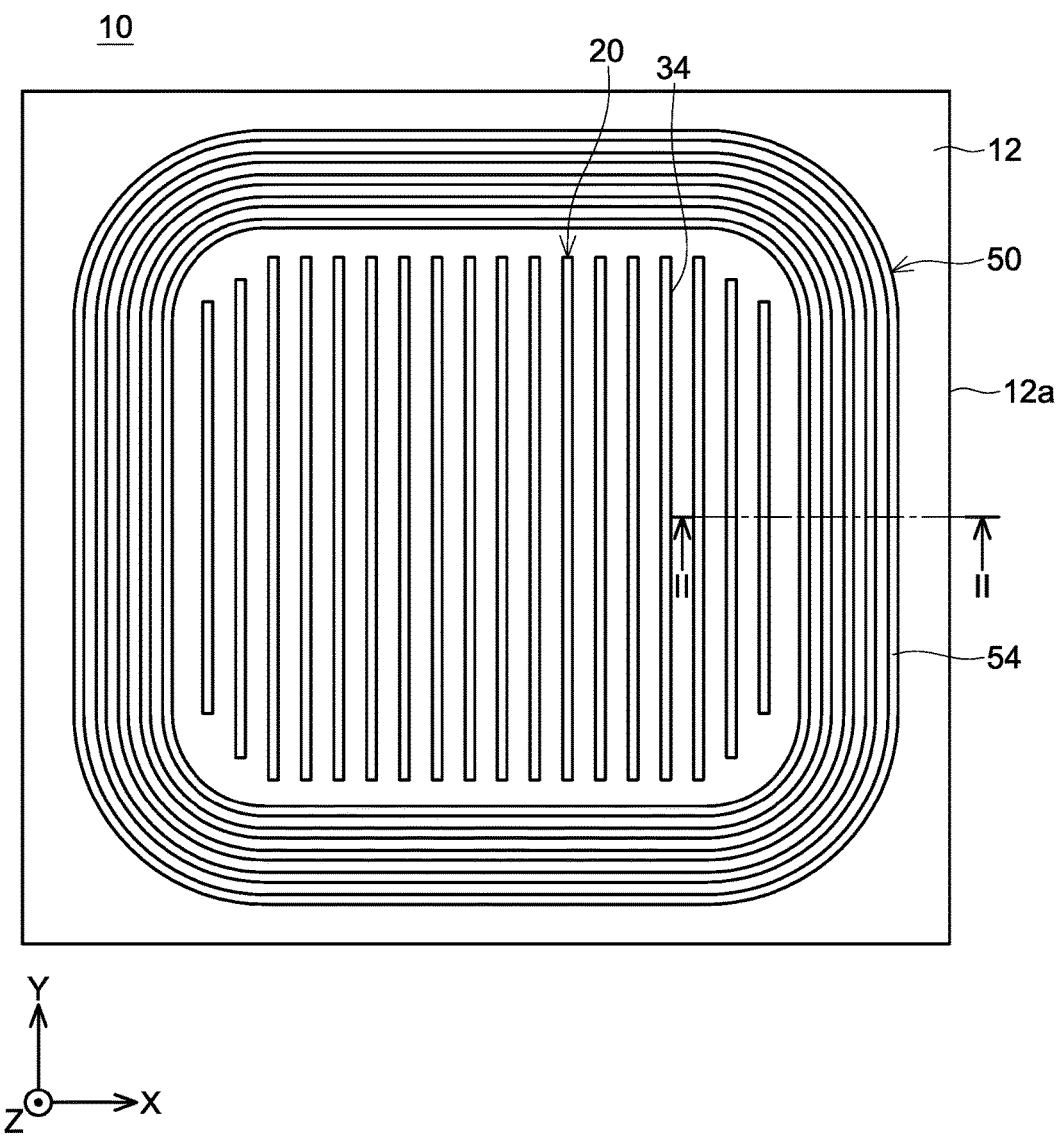
FIG. 1 is a plan view of a semiconductor device 10.

Initially, some features of the insulated gate semiconductor device in embodiments described below will be listed. Notably, each of the features below has utility independently.

(Feature 1)

The fifth region is configured to partially overlap with the sixth region in a plane view of the semiconductor substrate from a front side. By disposing the fifth and sixth regions as such, it is possible to dispose them more closely. This makes it possible to further improve the withstand voltage of the insulated gate semiconductor device. Moreover, manufacturing errors in positions of the fifth and sixth regions in the depth direction are smaller than the manufacturing errors in positions thereof in the plane direction. Accordingly, even if the fifth and sixth regions are disposed as described above, they can be prevented from being connected owing to manufacturing errors.

(Feature 2)

A thickness of the sixth region is thicker than a thickness of the fifth region. According to this configuration, the curve of an interface of the sixth region becomes gentler than the curve of an interface of the fifth region. The sixth region protrudes to the rear side with respect to the fifth region, and hence electric field concentration tends to occur. However, by making the curve of the interface of the sixth region gentle, the electric field concentration on the sixth region can be relaxed.

(Feature 3)

A first kind of second conductivity type impurities are included in the fifth region. A second kind of second conductivity type impurities are included in the sixth region. The second kind of second conductivity type impurities has a diffusion coefficient in the semiconductor substrate higher than a diffusion coefficient of the first kind of second conductivity type impurities in the semiconductor substrate. According to this configuration, the curve of the interface of the sixth region can be gentle.

(Feature 4)

The semiconductor substrate is constituted of SiC. Carbon and boron are included in the fifth region and the sixth region. A concentration of carbon in the fifth region is higher than a concentration of carbon in the sixth region. According to this configuration, the curve of the interface of the sixth region can be gentle.

(Feature 5)

A plurality of the first circumferential trenches and a plurality of the second circumferential trenches are repeatedly and alternately provided in the range outside the second region.

(Feature 6)

The insulated gate semiconductor device can be made by the following method. The method comprises steps of: forming the first circumferential trench; forming the fifth region by implanting second conductivity type impurities into the bottom surface of the first circumferential trench; forming the second circumferential trench; and forming the sixth region by implanting second conductivity type impurities into the bottom surface of the second circumferential trench.

(Feature 7)

One of the first and second circumferential trenches is initially formed. One of the fifth and sixth regions which is exposed on a bottom surface of the one trench is formed after the formation of the one trench. An insulating layer is formed in the one trench after the formation of the one region exposed on the bottom surface of the one trench. The other of the first and second circumferential trenches is formed after the formation of the insulating layer. The other of the fifth and sixth regions which is exposed on a bottom surface of the other trench is formed after the formation of the other trench. An insulating layer is formed in the other trench after the formation of the other region exposed on the bottom surface of the other trench. As such, by forming the other trench after the formation of the insulating layer in the one trench, it is possible to prevent cracks and the like that occur in a semiconductor layer interposed between these trenches (a partition that divides the two trenches).

(Feature 8)

The formation of the sixth region is performed before the formation of the fifth region. In the formation of the sixth region, the semiconductor substrate is annealed after the implantation of the second conductivity type impurities into the bottom surface of the second circumferential trench. In the formation of the fifth region, the semiconductor substrate is annealed after the implantation of the second conductivity type impurities into the bottom surface of the first circumferential trench. In this method, the sixth region is more annealed than the fifth region, and hence the curve of the interface of the sixth region can be gentle.

(Feature 9)

An annealing temperature in the formation of the sixth region is higher than an annealing temperature in the formation of the fifth region. According to this method, the curve of the interface of the sixth region can be gentler.

(Feature 10)

A first kind of second conductivity type impurities are implanted into the bottom surface of the first circumferential trench in the formation of the fifth region. A second kind of second conductivity type impurities are implanted into the bottom surface of the second circumferential trench in the formation of the sixth region. The second kind of second conductivity type impurities has a diffusion coefficient in the semiconductor substrate higher than a diffusion coefficient in of the first kind of second conductivity type impurities in the semiconductor substrate. According to this method, the curve of the interface of the sixth region can be gentle.

(Feature 11)

The semiconductor substrate is constituted of SiC. Carbon and boron are implanted into the bottom surface of the first circumferential trench in the formation of the fifth region. Boron is implanted into the bottom surface of the second circumferential trench in the formation of the sixth region. According to this method, the curve of the interface of the sixth region can be gentler.

(Feature 12)

The gate trenches are formed at the same time as the formation of the first circumferential trench.

First Embodiment

A semiconductor device 10 shown in FIG. 1 has a semiconductor substrate 12 constituted of SiC. The semiconductor substrate 12 has a cell region 20 and an outer circumferential region 50. The cell region 20 has a MOSFET provided therein. The outer circumferential region 50 is a region between the cell region 20 and an end surface 12a of the semiconductor substrate 12.

Figure 2:
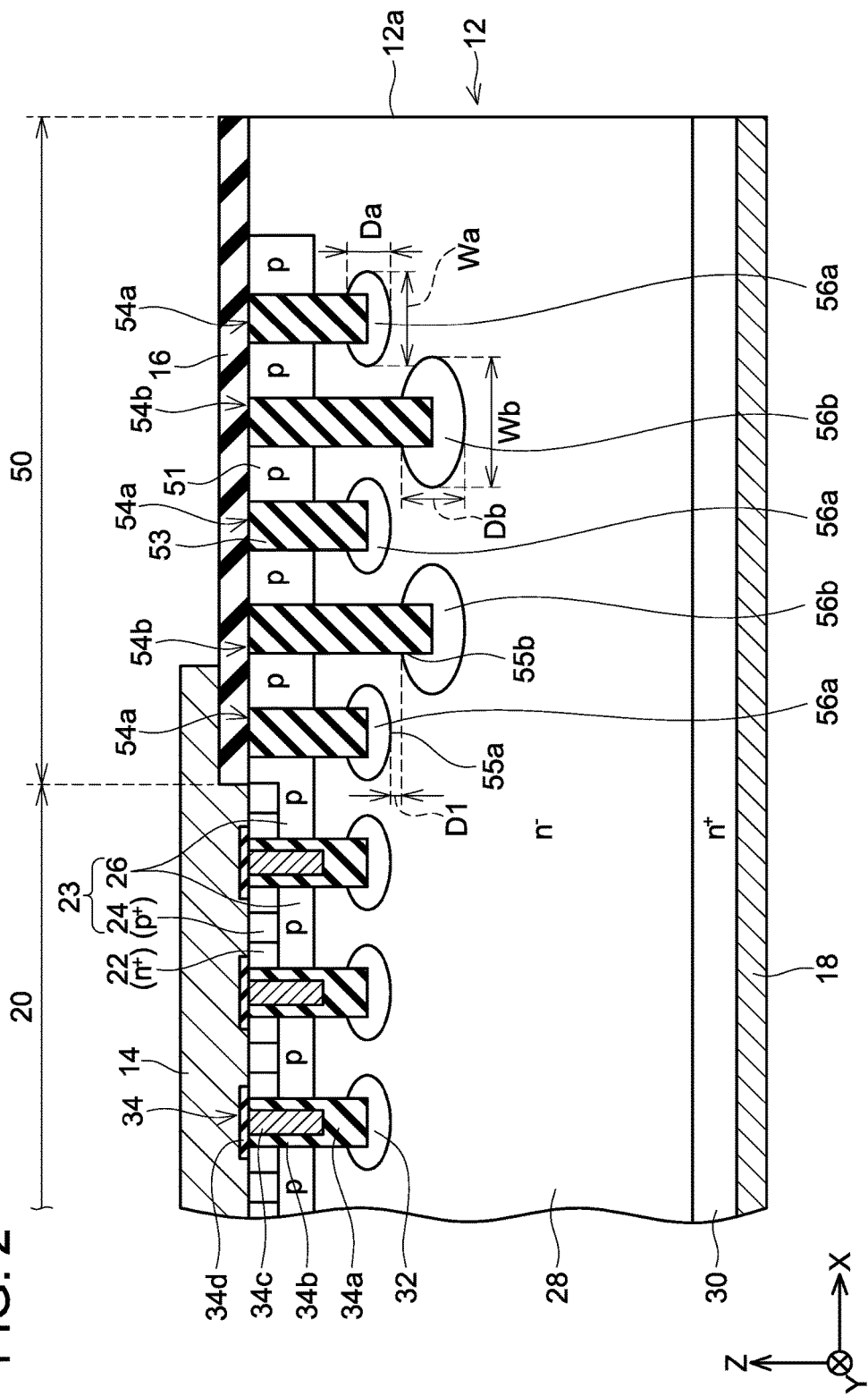
FIG. 2 is a vertical cross-sectional view taken along a line II-II in FIG. 1.

As shown in FIG. 2, a front electrode 14 and an insulating layer 16 are provided on a front surface of the semiconductor substrate 12. The insulating layer 16 covers the front surface of the semiconductor substrate 12 in the outer circumferential region 50. The front electrode 14 is in contact with the semiconductor substrate 12 in the cell region 20. In other words, a contact region where the front electrode 14 is in contact with the semiconductor substrate 12 is the cell region 20, and a region on an outer circumferential side (the end surface 12a side) with respect to the contact region is the outer circumferential region 50. A rear electrode 18 is provided on a rear surface of the semiconductor substrate 12. The rear electrode 18 covers approximately the entirety of the rear surface of the semiconductor substrate 12.

Source regions 22, a body region 23, a drift region 28, a drain region 30, p-type floating regions 32, and gate trenches 34, are provided in the cell region 20.

The source regions 22 (one example of the first region in claims) are n-type region that includes n-type impurities in a high concentration. The source regions 22 are provided in a range exposed on an upper surface of the semiconductor substrate 12. The source regions 22 are in contact with the front electrode 14, and are ohmic connected to the front electrode 14.

The body region 23 (one example of the second region in the claims) has a body contact region 24 and a low-concentration region 26. The body contact region 24 is a p-type region that includes p-type impurities in a high concentration. The body contact region 24 is provided to be exposed on the upper surface of the semiconductor substrate 12 at positions where the source regions 22 are not provided. The body contact region 24 is in contact with the front electrode 14, and is ohmic connected to the front electrode 14. The low-concentration region 26 is a p-type region that includes p-type impurities in a low concentration. The low-concentration region 26 has a p-type impurity concentration lower than the p-type impurity concentration in the body contact region 24. The low-concentration region 26 is provided under the source regions 22 and the body contact region 24, and is in contact with these regions.

The drift region 28 (one example of the third region in the claims) is an n-type region that includes n-type impurities in a low concentration. The drift region 28 has an n-type impurity concentration lower than the n-type impurity concentration in the source region 22. The drift region 28 is provided under the body region 23. The drift region 28 is in contact with the body region 23, and is separated from the source region 22 by the body region 23.

The drain region 30 is an n-type region that includes n-type impurities in a high concentration. The drain region 30 has an n-type impurity concentration higher than the n-type impurity concentration in the drift region 28. The drain region 30 is provided under the drift region 28. The drain region 30 is in contact with the drift region 28, and is separated from the body region 23 by the drift region 28. The drain region 30 is provided in a range exposed on a lower surface of the semiconductor substrate 12. The drain region 30 is ohmic connected to the rear electrode 18.

As shown in FIGS. 1 and 2, a plurality of the gate trenches 34 is provided in the upper surface of the semiconductor substrate 12 in the cell region 20. As shown in FIG. 1, the gate trenches 34 linearly extend in parallel to each other in the front surface of the semiconductor substrate 12. As shown in FIG. 2, each of the gate trenches 34 is provided to penetrate the corresponding source region 22 and the body region 23 and reach the drift region 28. A bottom insulating layer 34a, a gate insulating film 34b, and a gate electrode 34c are provided in each of the gate trenches 34. Each of the bottom insulating layers 34a is a thick insulating layer provided in a bottom portion of the corresponding gate trench 34. A lateral surface of each gate trench 34 above the bottom insulating layer 34a is covered with the corresponding gate insulating film 34b. Each gate electrode 34c is provided in the corresponding gate trench 34 above the corresponding bottom insulating layer 34a. Each gate electrode 34c faces the corresponding source region 22, the body region 23, and the drift region 28 via the corresponding gate insulating film 34b. The gate electrode 34c is insulated from the semiconductor substrate 12 by the corresponding gate insulating film 34b and the corresponding bottom insulating layer 34a. An upper surface of the gate electrode 34c is covered with a corresponding insulating layer 34d. The gate electrode 34e is insulated from the front electrode 14 by the corresponding insulating layer 34d.

Each of the p-type floating regions 32 (one example of the fourth region in claims) is provided in a range that is in the semiconductor substrate 12 and exposed on a bottom surface of the corresponding gate trenches 34 (i.e., a range that is in contact with that bottom surface). The circumference of each p-type floating region 32 is surrounded by the drift region 28. The p-type floating regions 32 are separated from each other by the drift region 28. Moreover, the p-type floating region 32 is separated from the body region 23 by the drift region 28.

In a range that is in the outer circumferential region 50 and exposed on the front surface of the semiconductor substrate 12, a p-type front surface region 51 is provided. The front surface region 51 spreads to approximately the same depth as that of the body region 23. The entirety of an upper surface of the front surface region 51 is covered with the insulating layer 16. Accordingly, the front surface region 51 is not in contact with the front electrode 14. The drift region 28 and the drain region 30, mentioned above, spread to the outer circumferential region 50. The drift region 28 and the drain region 30 spread to the end surface 12a of the semiconductor substrate 12. The drift region 28 is in contact with the front surface region 51 from below.

In the upper surface of the semiconductor substrate 12 in the outer circumferential region 50, a plurality of outer circumferential trenches 54 (i.e., 54a and 54b) is provided. Each of the outer circumferential trenches 54 is provided to penetrate the front surface region 51 and reach the drift region 28. As shown in FIG. 1, each of the outer circumferential trenches 54 is provided in an annular shape that surrounds the circumference of the cell region 20, when the semiconductor substrate 12 is viewed from above. As shown in FIG. 2, the front surface region 51 is separated from the body region 23 (i.e., the p-type region that is in contact with the source region 22 and the front electrode 14) by the outer circumferential trench 54 on the innermost circumferential side. Moreover, portions of the front surface region 51 are separated from each other by the outer circumferential trenches 54. In other words, a p-type region on an inner side with respect to the outer circumferential trench 54 on the innermost circumferential side is the body region 23, while a p-type region on the outer circumferential side with respect to the outer circumferential trench 54 on the innermost circumferential side is the front surface region 51. Accordingly, the outer circumferential trenches 54 are provided outside the body region 23. Provided in each of the outer circumferential trenches 54 is an insulating layer 53.

The outer circumferential trenches 54 have first outer circumferential trenches 54a and second outer circumferential trenches 54b. Each of the first outer circumferential trenches 54a has a depth approximately equal to the depth of each of the gate trenches 34. Each of the second outer circumferential trenches 54b is deeper than the first outer circumferential trench 54a. The outer circumferential trench 54 on the innermost circumferential side is the first outer circumferential trench 54a. The first outer circumferential trenches 54a and the second outer circumferential trenches 54b are repeatedly and alternately disposed from the inner circumferential side toward the outer circumferential side.

In a range that is in the semiconductor substrate 12 and exposed on a bottom surface of each of the outer circumferential trenches 54 (i.e., a range that is in contact with that bottom surface), a p-type bottom surface region 56 (i.e., 56a and 56b) is provided. Each of the bottom surface regions 56 is provided along the corresponding outer circumferential trench 54, so as to cover the entirety of the bottom surface of the corresponding outer circumferential trench 54. The circumference of each of the bottom surface regions 56 is surrounded by the drift region 28 in the outer circumferential region 50 (one example of the seventh region in claims). The bottom surface regions 56 are separated from each other by the drift region 28 in the outer circumferential region 50.

The bottom surface regions 56 have first bottom surface regions 56a exposed on bottom surfaces of the first outer circumferential trenches 54a (one example of the fifth region in claims), and second bottom surface regions 56b exposed on bottom surfaces of the second outer circumferential trenches 54b (one example of the sixth region in claims). Each of the first bottom surface region 56a is provided at a position shallower than that of each of the second bottom surface regions 56b. In other words, a lower end 55a of the first bottom surface region 56a is located above with respect to an upper end 55b of the second bottom surface region 56b. Accordingly, a spacing D1 is provided in a depth direction of the semiconductor substrate 12, between the lower end 55a of the first bottom surface region 56a and the upper end 55b of the second bottom surface region 56b. The first bottom surface region 56a is disposed to partially overlap with the second bottom surface region 56b located next thereto, in a plane view of the upper surface of the semiconductor substrate 12 (i.e., when viewed along the depth direction of the semiconductor substrate 12).

The first bottom surface regions 56a include Al (aluminum) as p-type impurities. The second bottom surface regions 56b include B (boron) as p-type impurities.

The second bottom surface region 56b has a thickness Db larger than a thickness Da of the first bottom surface region 56a. Moreover, the second bottom surface region 56b has a width Wb (a width in a direction from the inner circumferential side toward the outer circumferential side) that is larger than a width Wa of the first bottom surface region 56a. Therefore, the curve of an interface of the second bottom surface region 56b (an interface thereof with the drift region 28) is gentler than the curve of an interface of the first bottom surface region 56a (an interface thereof with the drift region 28). In other words, the curvature of the interface of the second bottom surface region 56b is smaller than the curvature of the interface of the first bottom surface region 56a.

Next, an operation of the semiconductor device 10 will be described. When the semiconductor device 10 is to be operated, a voltage that makes the rear electrode 18 positive is applied to between the rear electrode 18 and the front electrode 14. Furthermore, a gate-on voltage is applied to the gate electrode 34c to thereby turn on the MOSFET in the cell region 20. In other words, a channel is formed in the body region 23 at a position where the body region 23 faces the gate electrode 34c, and electrons flow from the front electrode 14 toward the rear electrode 18 through the source region 22, the channel, the drift region 28, and the drain region 30.

When the application of the gate-on voltage to the gate electrodes 34c is stopped, the channel disappears, and the MOSFET is turned off. When the MOSFET is turned off, a depletion layer spreads from a pn junction at a boundary portion between the body region 23 and the drift region 28 into the drift region 28. When the depletion layer reaches the p-type floating regions 32 in the cell region 20, the depletion layer also spreads from the p-type floating regions 32 into the drift region 28. Accordingly, the drift region 28 located between the two p-type floating regions 32 is depleted by the depletion layer that spreads from the p-type floating regions 32 on both sides. The depletion layer spreads in the cell region 20 as such, to thereby realize a high withstand voltage in the cell region 20.

Moreover, the depletion layer that spreads from the pn junction mentioned above reaches the first bottom surface region 56a under the first outer circumferential trench 54a located closest to the cell region 20. Consequently, the depletion layer spreads from the first bottom surface region 56a into the drift region 28 around the circumference of the first bottom surface region 56a. The spacing between the first bottom surface region 56a and the second bottom surface region 56b located next thereto (next thereto on the outer circumferential side) is narrow, and hence the depletion layer that spreads from the first bottom surface region 56a reaches the second bottom surface region 56b located next thereto. Consequently, the depletion layer spreads from that second bottom surface region 56b into the drift region 28 around the circumference of the second bottom surface region 56b. The spacing between the second outer circumferential trench 54b and the first bottom surface region 56a located next thereto (next thereto on the outer circumferential side) is narrow, and hence the depletion layer that spreads from the second bottom surface region 56b reaches the first bottom surface region 56a located next thereto. As such, the depletion layer spreads to the outer circumferential side through the first bottom surface regions 56a and the second bottom surface regions 56b. The depletion layer spreads, as such, from the bottom surface region 56 on the innermost circumferential side to the bottom surface region 56 on the outermost circumferential side. The depletion layer spreads widely, as such, in the drift region 28 in the outer circumferential region 50. The bottom surface regions 56 are separated from each other by the drift region 28. Accordingly, a potential difference is generated between every two of the bottom surface regions 56. Accordingly, in the outer circumferential region 50, the potential is distributed so as to be gradually changed from the inner circumferential side toward the outer circumferential side. As such, by allowing the depletion layer to spread in the outer circumferential region 50, and additionally, allowing a potential distribution in which the potential is moderately changed to be generated in the outer circumferential region 50, electric field concentration in the outer circumferential region 50 is restrained. Accordingly, the semiconductor device 10 achieves a high withstand voltage.

Moreover, the second bottom surface regions 56b protrudes below with respect to the first bottom surface regions 56a. Therefore, in a state where the depletion layer spreads in the outer circumferential region 50, an electric field easily concentrates around the circumference of the second bottom surface regions 56b. In the semiconductor device 10, however, each of the second bottom surface regions 56b has a large thickness Db, thereby ensuring the curve of the interface of the second bottom surface region 56b to be gentle. By ensuring the curve of the interface of the second bottom surface region 56b to be gentle as such, the electric field concentration in the periphery of the second bottom surface region 56b is restrained. The withstand voltage of the semiconductor device 10 is thereby further improved.

Figure 3:
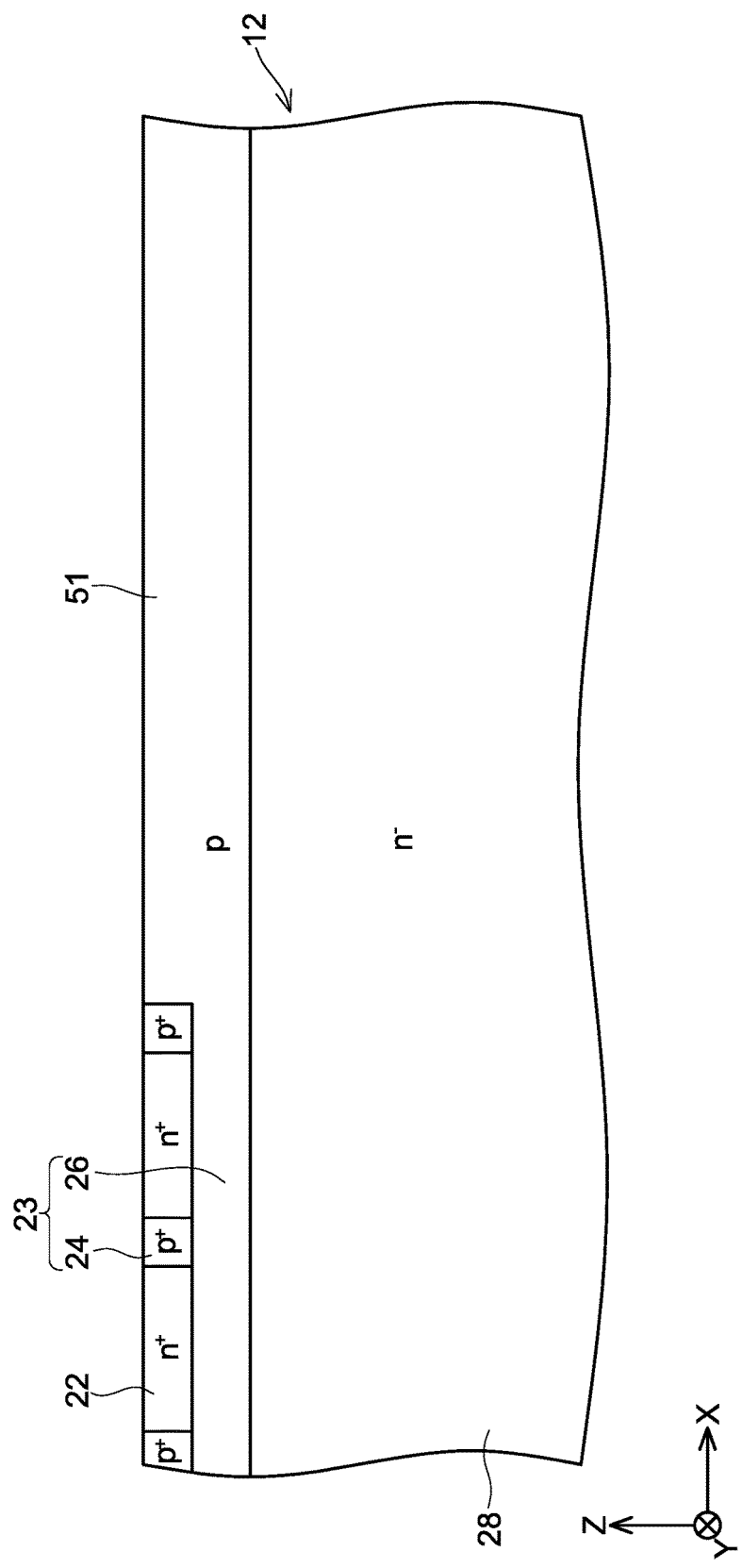
FIG. 3 is an explanatory diagram of a manufacturing step of the semiconductor device 10.

Next, a method for manufacturing the semiconductor device 10 will be described. In the manufacturing method in the first embodiment, the source regions 22, the body region 23, and the front surface region 51 are initially formed in the semiconductor substrate 12, as shown in FIG. 3, by epitaxial growth, ion implantation, or the like.

Figure 4:
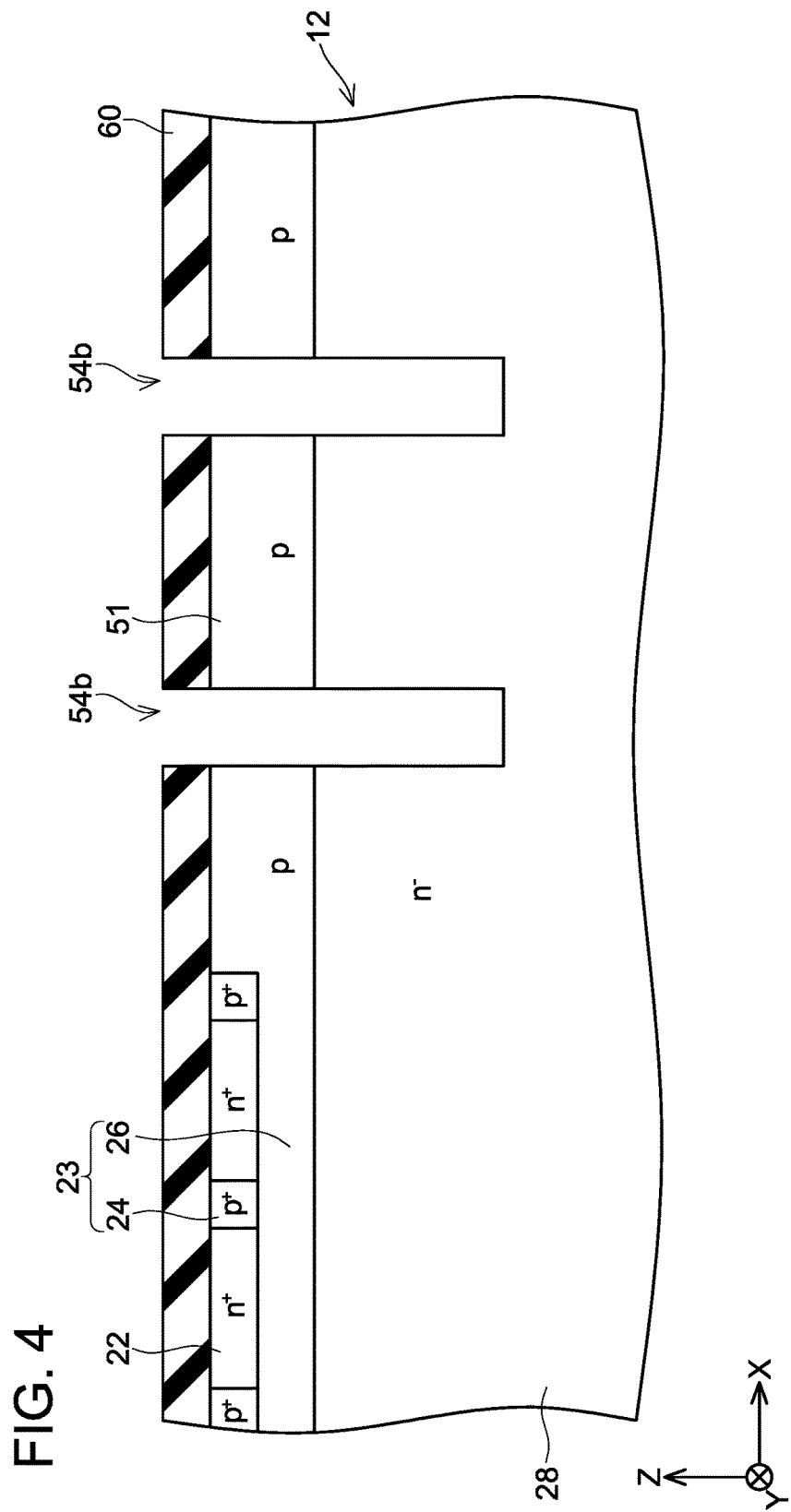
FIG. 4 is an explanatory diagram of a manufacturing step of the semiconductor device 10.

Next, as shown in FIG. 4, a mask 60 (e.g., an oxide film) that has openings is formed on the front surface of the semiconductor substrate 12, and the semiconductor substrate 12 in the openings is etched by anisotropic etching. The second outer circumferential trenches 54b are thereby formed.

Figure 5:
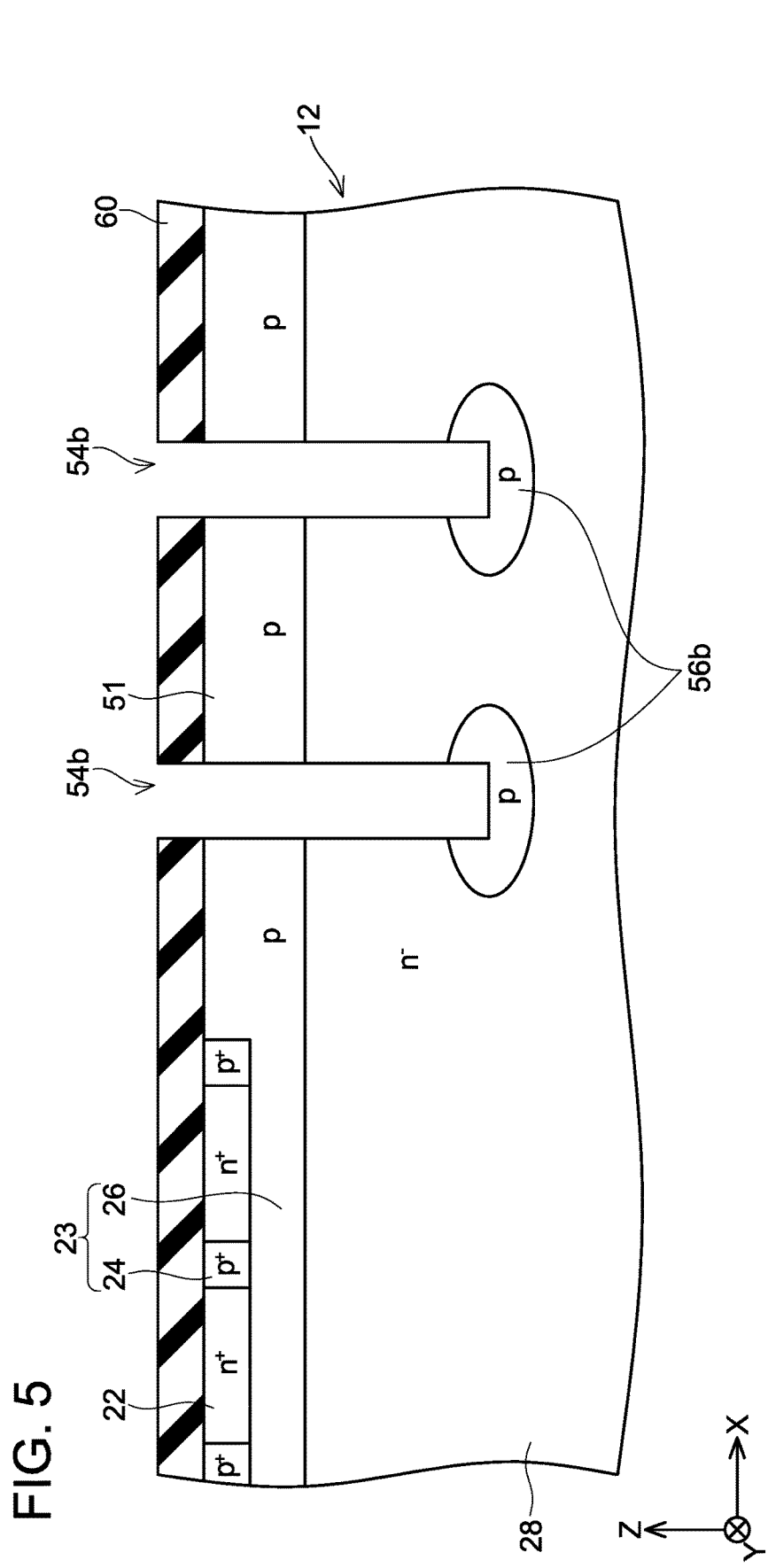
FIG. 5 is an explanatory diagram of a manufacturing step of the semiconductor device 10.

Next, B (boron: one example of the second kind of second conductivity type impurities in claims) is implanted into the bottom surface of each of the second outer circumferential trenches 54b, and then the semiconductor substrate 12 is annealed (first annealing). The implanted B is thereby activated and diffused. As shown in FIG. 5, the second bottom surface regions 56b are thereby formed.

Next, an insulator is grown in each of the second outer circumferential trenches 54b to thereby form the insulating layer 53 in the second outer circumferential trench 54b.

Figure 6:
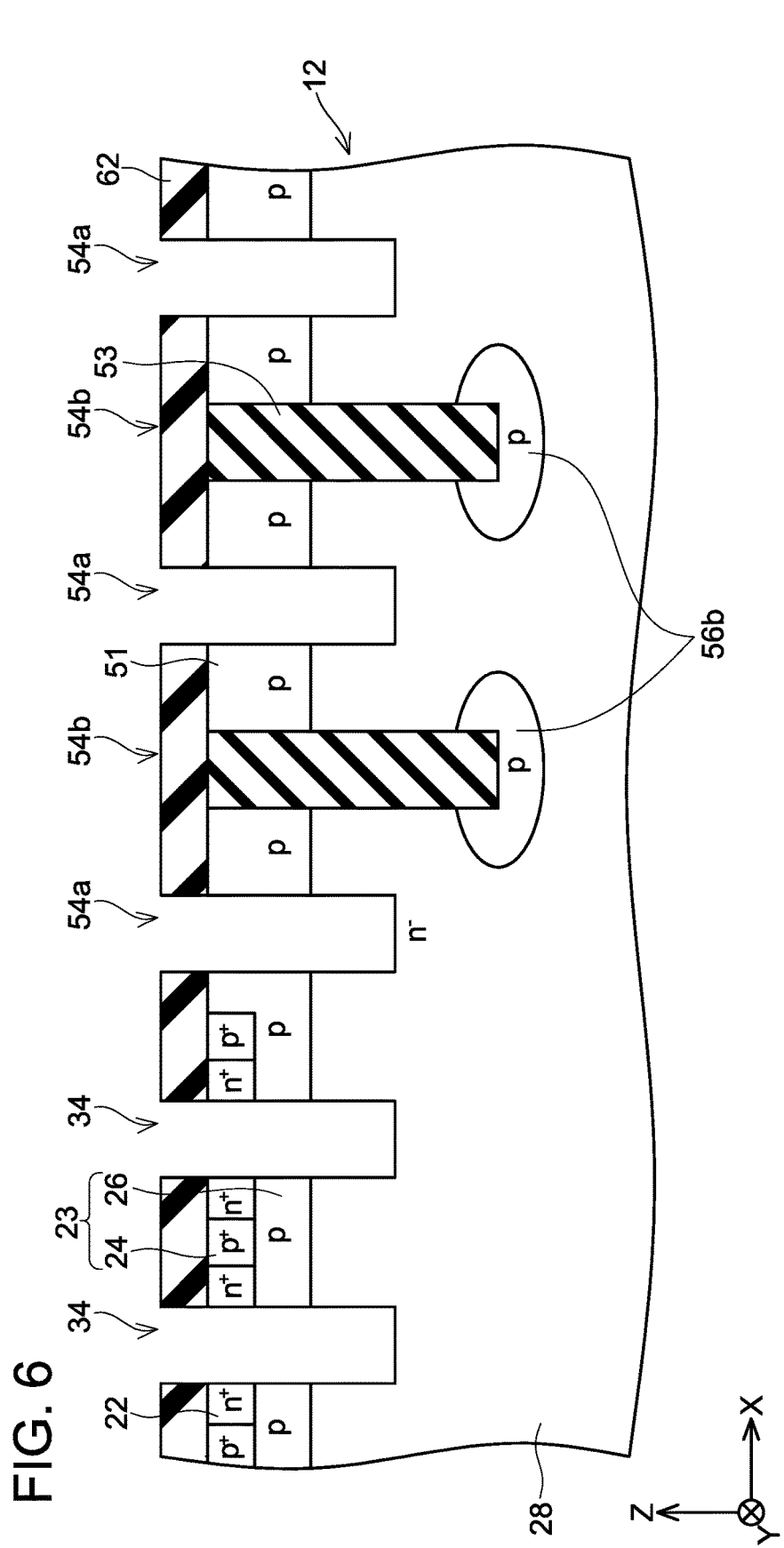
FIG. 6 is an explanatory diagram of a manufacturing step of the semiconductor device 10.

Next, as shown in FIG. 6, a mask 62 (e.g., an oxide film) that has openings is formed on the front surface of the semiconductor substrate 12, and the semiconductor substrate 12 in the openings is etched by anisotropic etching. The first outer circumferential trenches 54a and the gate trenches 34 are thereby formed. The first outer circumferential trenches 54a and the gate trenches 34 are formed to be shallower than the second outer circumferential trenches 54b. Moreover, each of the first outer circumferential trenches 54a is formed to be located next to the corresponding second outer circumferential trench 54b such that the first outer circumferential trenches 54a and the second outer circumferential trenches 54b are repeatedly and alternately disposed.

Figure 7:
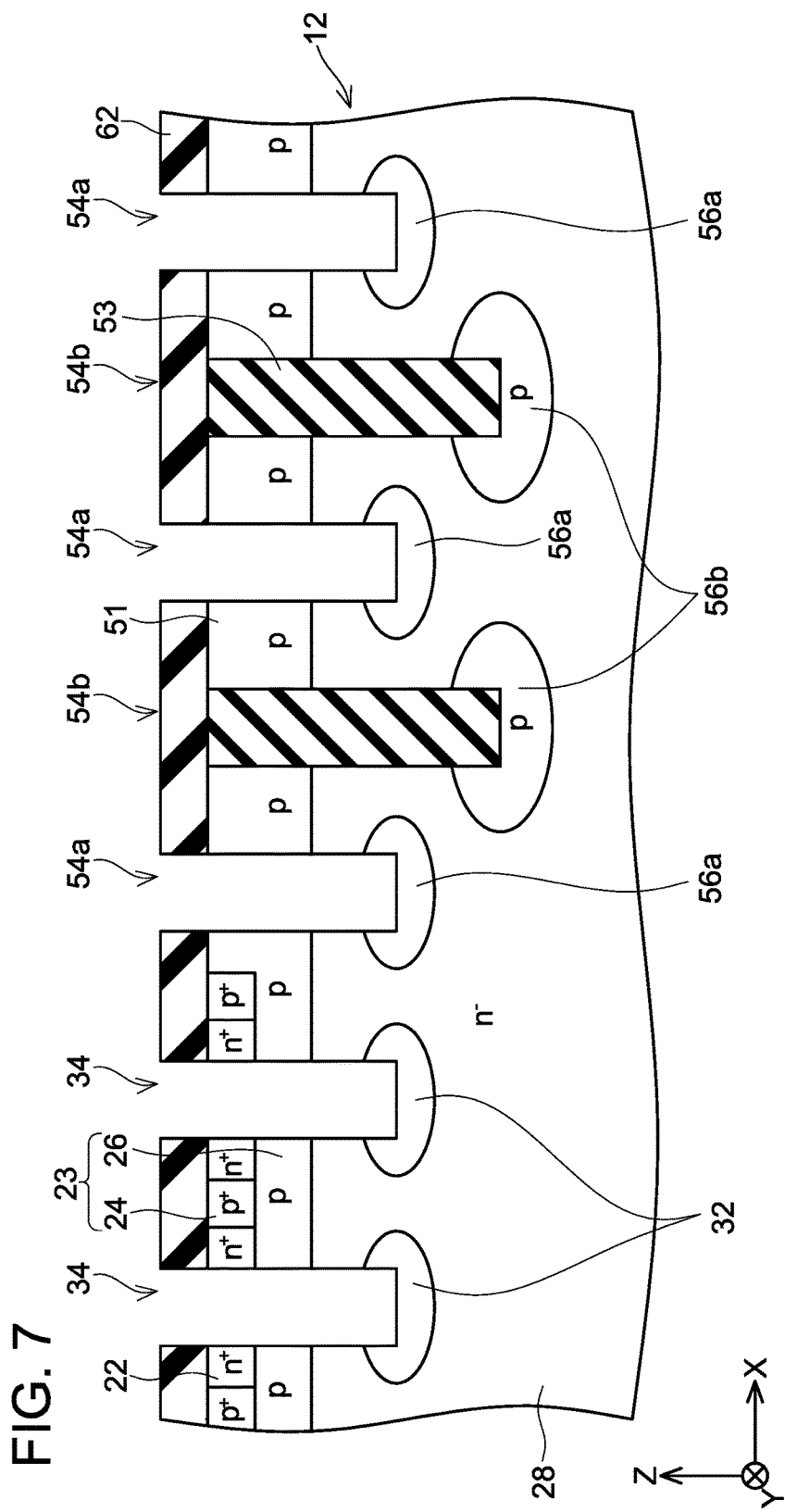
FIG. 7 is an explanatory diagram of a manufacturing step of the semiconductor device 10.

Next, Al (aluminum: one example of the first kind of second conductivity type impurities in claims) is implanted into the bottom surfaces of the first outer circumferential trenches 54a and the bottom surfaces of the gate trenches 34, and then the semiconductor substrate 12 is annealed (second annealing). Notably, the second annealing is performed at a temperature lower than that of the first annealing. The implanted Al is thereby activated and diffused. As shown in FIG. 7, the first bottom surface regions 56a and the p-type floating regions 32 are thereby formed.

Next, an insulator is grown inside the first outer circumferential trenches 54a and the gate trenches 34. The insulating layers 53 are thereby formed in the first outer circumferential trenches 54a. Next, the insulator in the gate trenches 34 is partially removed, and then the gate insulating films 34b and the gate electrodes 34c are formed in the gate trenches 34.

Next, the insulating layers 34d, the insulating layer 16, and the front electrode 14 are formed on the upper surface of the semiconductor substrate 12 to thereby complete the structures on the upper surface side of the semiconductor device 10. Next, the structures on the lower surface side of the semiconductor substrate 12 (i.e., the drain region 30 and the rear electrode 18) are formed. The semiconductor device 10 in FIGS. 1 and 2 is thereby completed.

Figure 8:
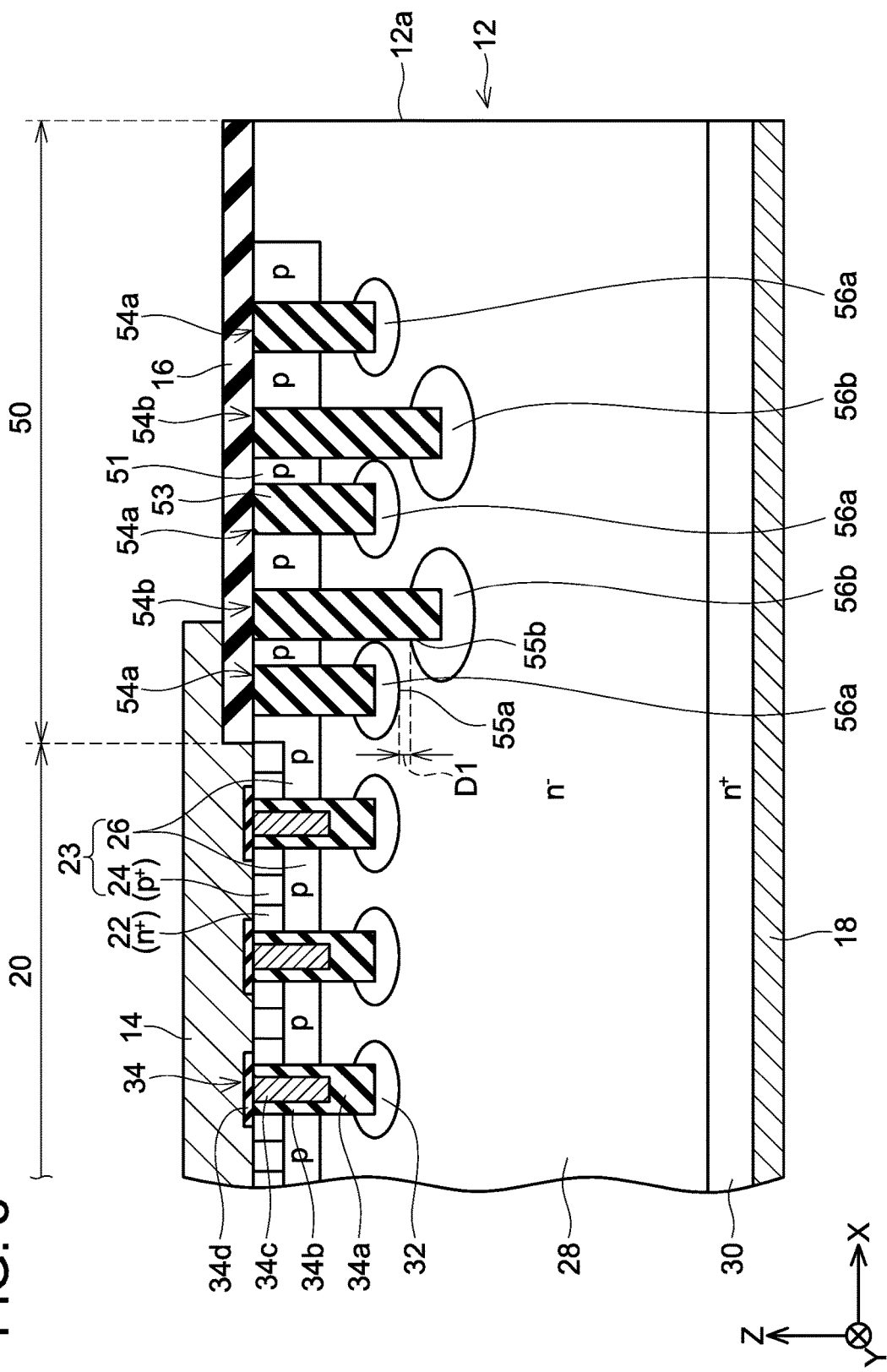

In the above-mentioned manufacturing steps of the semiconductor device 10, relative positions of the first and second outer circumferential trenches 54a and 54b tend to be displaced in a direction along the upper surface of the semiconductor substrate 12 (i.e., the X and Y directions). In other words, errors in positions of the first and second outer circumferential trenches 54a and 54b in the X and Y directions are large. In the above-described embodiment, in particular, the first and second outer circumferential trenches 54a and 54b are formed in the separate steps, and hence these errors become much larger. The position of each of the first bottom surface regions 56a in the X and Y directions changes depending on the position of the corresponding first outer circumferential trench 54a, and the position of each of the second bottom surface regions 56b in the X and Y directions changes depending on the position of the corresponding second outer circumferential trench 54b. Therefore, the relative positions of the first and second bottom surface regions 56a and 56b tend to be displaced in the X and Y directions. In this semiconductor device 10, however, the first and second bottom surface regions 56a and 56b differ in positions in the thickness direction of the semiconductor substrate 12 (i.e., the Z direction). More specifically, the spacing D1 is formed between the first and second bottom surface regions 56a and 56b. Therefore, even if the relative positions of the first and second bottom surface regions 56a and 56b are significantly displaced in the X or Y direction, the first and second bottom surface regions 56a and 56b are not connected. For example, as shown in FIG. 8, even if the second bottom surface region 56b is shifted toward the first bottom surface region 56a side owing to manufacturing errors, the first bottom surface region 56a is not connected to the second bottom surface region 56b. As such, according to the structure of the semiconductor device 10, it is possible to prevent the first bottom surface region 56a from being connected to the second bottom surface region 56b owing to manufacturing errors.

Moreover, the position of each of the first bottom surface regions 56a in the Z direction changes depending on the depth of the corresponding first outer circumferential trench 54a, and the implantation range and the diffusion range of impurities into the first bottom surface region 56a itself. Moreover, the position of each of the second bottom surface regions 56b in the Z direction changes depending on the depth of the corresponding second outer circumferential trench 54b, and the implantation range and the diffusion range of impurities into the second bottom surface region 56b itself. The depth of each of the trenches, and the implantation range and the diffusion range of impurities can be controlled exactly. Therefore, the positions of the first and second bottom surface regions 56a and 56b in the Z direction can be controlled more exactly than the positions thereof in the X and Y directions. Therefore, according to the above-described manufacturing method, the spacing D1 between the first and second bottom surface regions 56a and 56b in the Z direction can be controlled exactly. The spacing D1 can thereby be reduced. Therefore, according to the above-described manufacturing method, the withstand voltage of the outer circumferential region 50 can be improved.

Moreover, in the above-described manufacturing method, Al is implanted as the p-type impurities in the first bottom surface regions 56a, while B is implanted as the p-type impurities in the second bottom surface regions 56b. The diffusion coefficient of B in the semiconductor substrate 12 (i.e., SiC) is higher than the diffusion coefficient of Al therein. Accordingly, the second bottom surface regions 56b can be made larger than the first bottom surface regions 56a.

Moreover, in the above-described manufacturing method, the first annealing is performed at a temperature higher than that of the second annealing. Therefore, the diffusion distance of B in the first annealing is longer. This also ensures the second bottom surface regions 56b to be formed larger than the first bottom surface regions 56a.

Moreover, in the above-described manufacturing method, the second bottom surface regions 56b are formed before the first bottom surface regions 56a. Therefore, the second bottom surface regions 56b are heated not only in the first annealing but also in the second annealing. In the second annealing, the B in the second bottom surface regions 56b further diffuses, causing the second bottom surface regions 56b to be enlarged. This also ensures the second bottom surface regions 56b to be formed larger than the first bottom surface regions 56a.

The second bottom surface regions 56b are made larger than the first bottom surface regions 56a as described above, and hence the thickness Db of each of the second bottom surface regions 56b becomes larger than the thickness Da of each of the first bottom surface regions 56a. As a result, the curve of the interface of the second bottom surface region 56b becomes gentler than the curve of the interface of the first bottom surface region 56a. The second bottom surface regions 56b are formed as such, and hence electric field concentration in the periphery of the second bottom surface regions 56b when the MOSFET is off can be restrained as mentioned above.

Moreover, electric field concentration less easily occurs around the circumference of the first bottom surface regions 56a, and hence even if the interface of each of the first bottom surface regions 56a has a large curvature, a problem of electric field concentration does not occur. Moreover, the reduction in size of the first bottom surface regions 56a as such makes it possible to reduce the size of the semiconductor device 10.

Moreover, in the above-described manufacturing method, the first and second outer circumferential trenches 54a and 54b are formed in the separate steps. If the first and second outer circumferential trenches 54a and 54b are formed at the same time, cracks tend to occur in thin partitions (a semiconductor layer) between the first and second outer circumferential trenches 54a and 54b. In contrast to this, if the second outer circumferential trenches 54b are formed, and the insulating layers 53 are then embedded in the second outer circumferential trenches 54b and the first outer circumferential trenches 54a are formed thereafter, thin partitions are not formed, which makes it possible to restrain cracks. Notably, if the first outer circumferential trenches 54a are initially formed, and the insulating layers 53 are then embedded in the first outer circumferential trenches 54a and the second outer circumferential trenches 54b are formed thereafter, the problem of cracks in the partitions can also be eliminated.

Second Embodiment

In a semiconductor device in a second embodiment, both of the p-type impurities included in the first bottom surface regions 56a and the p-type impurities included in the second bottom surface regions 56b are B. Moreover, the concentration of C (carbon) in each of the first bottom surface regions 56a is higher than each of the concentration of C in the second bottom surface regions 56b. Other configurations in the semiconductor device in the second embodiment are equal to those in the semiconductor device 10 in the first embodiment. Therefore, the semiconductor device in the second embodiment operates similarly to the semiconductor device 10 in the first embodiment.

A method for manufacturing the semiconductor device in the second embodiment will be described. Initially, as in the first embodiment, the structure shown in FIG. 6 is formed. Next, C is implanted into the bottom surfaces of the first outer circumferential trenches 54a. The concentration of C in the periphery of the bottom surface of the first outer circumferential trenches 54a is thereby increased. Next, B is implanted into the bottom surfaces of the first outer circumferential trenches 54a. In other words, here, the bottom surfaces of the first outer circumferential trenches 54a are co-doped with C and B. Next, the semiconductor substrate 12 is annealed (second annealing). The B implanted into the semiconductor substrate 12 is thereby activated and diffused. As shown in FIG. 7, the first bottom surface regions 56a are thereby formed. Notably, in the manufacturing method in the second embodiment as well, the p-type floating regions 32 may be formed at the same time as the formation of the first bottom surface regions 56a. Afterwards, as in the method in the first embodiment, the semiconductor device in the second embodiment is completed.

If the semiconductor substrate 12 (i.e., SiC) is co-doped with B and C, the diffusion coefficient of B in the semiconductor substrate 11 becomes small. In other words, B less easily diffuses. Therefore, according to the manufacturing method in the second embodiment, the small first bottom surface regions 56a can be formed. Moreover, only B is implanted into the second bottom surface regions 56b, and C is not implanted thereinto, and hence in the manufacturing method in the second embodiment as well, the large second bottom surface regions 56b are formed as in the manufacturing method in the first embodiment. Accordingly, as shown in FIG. 2, in the manufacturing method in the second embodiment as well, the second bottom surface regions 56b can be made larger than the first bottom surface regions 56a.

Notably, in the manufacturing method in the second embodiment as well, the temperature of the second annealing may be set higher than the temperature of the first annealing as in the manufacturing method in the first embodiment.

Figure 9:
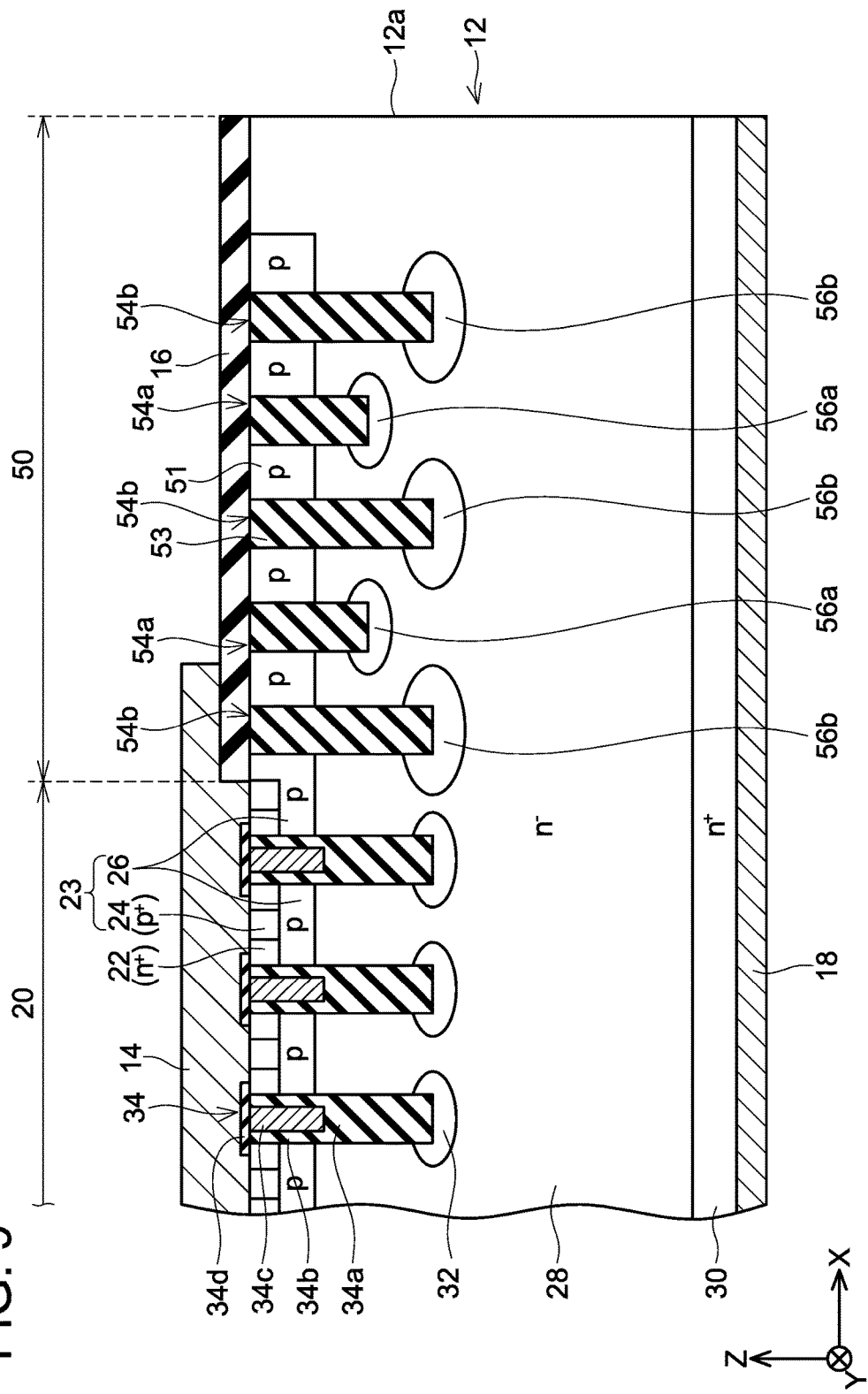
FIG. 9 is a vertical cross-sectional view, corresponding to FIG. 2, of a semiconductor device in a first variation.

Notably, in the first and second embodiments mentioned above, the outer circumferential trench 54 on the innermost circumferential side (on the side close to the body region 23) is the first outer circumferential trench 54a. However, as shown in FIG. 9, the outer circumferential trench 54 on the innermost circumferential side may be the second outer circumferential trench 54b (the deep trench). Moreover, in FIGS. 2 and 9, the gate trenches 34 and the outer circumferential trench 54 on the innermost circumferential side have approximately the same depth. However, the outer circumferential trench 54 on the innermost circumferential side may be deeper than the gate trenches 34, or may be shallower than the gate trenches 34.

Moreover, in the above-mentioned embodiments, a plurality of the first outer circumferential trenches 54a and a plurality of the second outer circumferential trenches 54b are repeatedly and alternately provided. However, in a partial region, the two first outer circumferential trenches 54a may be provided side by side, or the two second outer circumferential trenches 54b may be provided side by side. Moreover, the one first outer circumferential trench 54a and the one second outer circumferential trench 54b may be provided in the outer circumferential region 50. In other words, if there is provided a structure where the second outer circumferential trench 54b is provided to be located next to the first outer circumferential trench 54a in the outer circumferential region 50, the effects of the embodiments mentioned above can be obtained.

Moreover, in the above-mentioned embodiments, the second bottom surface regions 56b are thicker than the first bottom surface regions 56a. However, if electric field concentration in the periphery of the second bottom surface regions 56b is not so problematic, each of the second bottom surface regions 56b may have a thickness equal to or smaller than each of the thickness of the first bottom surface regions 56a.

Moreover, in the above-mentioned embodiments, the first and second bottom surface regions 56a and 56b partially overlap in a plane view of the upper surface of the semiconductor substrate 12. However, as shown in FIG. 10, they may not overlap. Even with such a configuration, it is possible to prevent the first and second bottom surface regions 56a and 56b from being mutually connected owing to errors in positions thereof in the X or Y direction. Moreover, even if the first and second bottom surface regions 56a and 56b do not overlap, the depletion layer can be spread from the first bottom surface region 56a to the second bottom surface region 56b (or from the second bottom surface region 56b to the first bottom surface region 56a).

Moreover, in the above-mentioned embodiments, the semiconductor substrate 12 is constituted of SiC. However, a semiconductor substrate constituted of another material such as Si may be used. Moreover, in place of the p-type floating regions 32 in the embodiments mentioned above, a p-type region connected to a prescribed potential may be provided.

Although practical examples of the present invention have been described in details above, they are merely illustrative, and are in no way intended to restrict the appended claims. The art recited in the appended claims embraces various alterations and modifications of the practical examples illustrated above. The technical elements described in the present specification or the drawings exhibit technical utility alone or in various combinations, and are not limited to the combinations recited in the originally-filed claims. Moreover, the art illustrated in the present specification or the drawings accomplishes a plurality of objects at the same time, and has technical utility by simply accomplishing one of these objects.

The invention claimed is:

1. An insulated gate semiconductor device, comprising:
   a semiconductor substrate;
   a front electrode provided on a front surface of the semiconductor substrate; and
   a rear electrode provided on a rear surface of the semiconductor substrate,
   wherein
   the insulated gate semiconductor device is configured to switch a conducting path between the front electrode and the rear electrode, and
   the semiconductor substrate comprises:
   a first region of a first conductivity type being in contact with the front electrode;
   a second region of a second conductivity type being in contact with the front electrode and the first region;
   a third region of the first conductivity type separated from the first region by the second region;
   a plurality of gate trenches provided in the front surface and penetrating the second region so as to reach the third region;
   a plurality of fourth regions of the second conductivity type each of which is exposed on a bottom surface of the corresponding gate trench;
   a plurality of first circumferential trenches and a plurality of the second circumferential trenches which are provided in the front surface in a range outside the second region, the first circumferential trenches and the second circumferential trenches being repeatedly and alternately provided in the range outside the second region, and the second circumferential trenches having a depth deeper than a depth of the first circumferential trenches;
   fifth regions of the second conductivity type each of which is exposed on a bottom surface of the corresponding first circumferential trench;
   sixth regions of the second conductivity type each of which is exposed on a bottom surface of the corresponding second circumferential trench, front side end portions of the sixth regions being located on a rear side with respect to rear side end portions of the fifth regions; and
   a seventh region of the first conductivity type connected to the third region and separating the fifth regions from the sixth regions.

2. The insulated gate semiconductor device of claim 1, wherein each of the fifth regions is configured to partially overlap with the corresponding sixth region in a plane view of the semiconductor substrate from a front side.

3. The insulated gate semiconductor device of claim 1, wherein thicknesses of the sixth regions are thicker than thicknesses of the fifth regions.

4. The insulated gate semiconductor device of claim 3, wherein
a first kind of second conductivity type impurities are included in the fifth regions, and
a second kind of second conductivity type impurities are included in the sixth regions, the second kind of second conductivity type impurities having a diffusion coefficient in the semiconductor substrate higher than a diffusion coefficient of the first kind of second conductivity type impurities in the semiconductor substrate.

5. The insulated gate semiconductor device of claim 3, wherein
the semiconductor substrate is constituted of SiC,
carbon and boron are included in the fifth regions and the sixth regions, and
a concentration of carbon in the fifth regions is higher than a concentration of carbon in the sixth regions.

6. The insulated gate semiconductor device of claim 1, wherein the fifth regions and the sixth regions are provided in a range within which a depletion layer spreading from a border of the second region and the third region reaches when the insulated gate semiconductor device turns off.

7. A method for manufacturing the insulated gate semiconductor device of claim 1, the method comprising:
forming the first circumferential trenches;
forming the fifth regions by implanting second conductivity type impurities into the bottom surfaces of the first circumferential trenches;
forming the second circumferential trenches; and
forming the sixth regions by implanting second conductivity type impurities into the bottom surfaces of the second circumferential trenches.

8. The method of claim 7, wherein
either of the first or second circumferential trenches are formed,
either of the fifth or sixth regions which are exposed on bottom surfaces of the either trenches are formed after the formation of the either trenches,
insulating layers are formed in the either trenches after the formation of the either regions exposed on the bottom surfaces of the either trenches,
the other of the first and second circumferential trenches are formed after the formation of the insulating layers,
the other of the fifth and sixth regions which are exposed on bottom surfaces of the other trenches are formed after the formation of the other trenches, and
insulating layers are formed in the other trenches after the formation of the other regions exposed on the bottom surfaces of the other trenches.

9. The method of claim 7, wherein
the formation of the sixth regions is performed before the formation of the fifth regions,
in the formation of the sixth regions, the semiconductor substrate is annealed after the implantation of the second conductivity type impurities into the bottom surfaces of the second circumferential trenches, and
in the formation of the fifth regions, the semiconductor substrate is annealed after the implantation of the second conductivity type impurities into the bottom surfaces of the first circumferential trenches.

10. The method of claim 9, wherein an annealing temperature in the formation of the sixth regions is higher than an annealing temperature in the formation of the fifth regions.

11. The method of claim 7, wherein
a first kind of second conductivity type impurities are implanted into the bottom surfaces of the first circumferential trenches in the formation of the fifth regions; and
a second kind of second conductivity type impurities are implanted into the bottom surfaces of the second circumferential trenches in the formation of the sixth regions, the second kind of second conductivity type impurities having a diffusion coefficient in the semiconductor substrate higher than a diffusion coefficient of the first kind of second conductivity type impurities in the semiconductor substrate.

12. The method of claim 7, wherein
the semiconductor substrate is constituted of SiC,
carbon and boron are implanted into the bottom surfaces of the first circumferential trenches in the formation of the fifth regions, and
boron is implanted into the bottom surfaces of the second circumferential trenches in the formation of the sixth regions.

13. The method of claim 7, wherein the gate trenches are formed at the same time as the formation of the first circumferential trenches.

* * * * *